(12) United States Patent
Fukuda

(10) Patent No.: US 8,279,618 B2
(45) Date of Patent: Oct. 2, 2012

(54) CIRCUIT SUBSTRATE AND CIRCUIT SUBSTRATE MANUFACTURING METHOD

(75) Inventor: Yutaka Fukuda, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 419 days.

(21) Appl. No.: 12/717,170

(22) Filed: Mar. 4, 2010

(65) Prior Publication Data

US 2010/0147570 A1    Jun. 17, 2010

Related U.S. Application Data

(63) Continuation of application No. PCT/JP2008/065894, filed on Sep. 3, 2008.

(30) Foreign Application Priority Data

Sep. 6, 2007   (JP) .................................. 2007-231313

(51) Int. Cl.
  *H05K 7/10*   (2006.01)
  *H05K 7/00*   (2006.01)
  *H05K 1/16*   (2006.01)

(52) U.S. Cl. ........ 361/768; 361/760; 361/769; 361/774; 174/260; 174/261; 174/262

(58) Field of Classification Search ........................ None
See application file for complete search history.

(56) References Cited

U.S. PATENT DOCUMENTS

| | | | |
|---|---|---|---|
| 4,896,464 A | 1/1990 | Kim et al. | |
| 5,525,402 A | 6/1996 | Nakamura et al. | |
| 5,734,560 A * | 3/1998 | Kamperman et al. | 361/774 |
| 6,229,220 B1 * | 5/2001 | Saitoh et al. | 257/780 |
| 6,306,680 B1 * | 10/2001 | Fillion et al. | 438/106 |
| 6,469,394 B1 | 10/2002 | Wong et al. | |
| 7,159,313 B2 * | 1/2007 | Sathe et al. | 29/846 |
| 7,307,221 B2 * | 12/2007 | Pan | 174/260 |
| 7,382,005 B2 * | 6/2008 | Lin et al. | 257/288 |
| 7,586,185 B2 * | 9/2009 | Fukasawa | 257/688 |
| 7,936,568 B2 * | 5/2011 | Mashino | 361/766 |
| 2001/0026954 A1 | 10/2001 | Takao | |
| 2004/0188813 A1 | 9/2004 | Agraharam et al. | |
| 2008/0245554 A1 * | 10/2008 | Pan | 174/260 |

FOREIGN PATENT DOCUMENTS

JP         01-321694 A       12/1989

(Continued)

OTHER PUBLICATIONS

Official Communication issued in corresponding European Patent Application No. 08829257.8, mailed on Aug. 20, 2010.
Official Communication issued in International Patent Application No. PCT/JP2008/065894, mailed on Oct. 14, 2008.
Rogers et al.; "Method of Joining Multilayer Ceramic Substrates to Printed Circuit Boards"; IBM Technical Disclosure Bulletin; Oct. 1980; pp. 1888 & 1889; vol. 23; No. 5.

(Continued)

*Primary Examiner* — Boris Chervinsky
(74) *Attorney, Agent, or Firm* — Keating & Bennett, LLP

(57) ABSTRACT

A circuit substrate includes protruding terminals and has a structure that ensures an excellent connection with an electronic component, such as an IC. The circuit substrate on which an IC is to be mounted includes terminals that are to be electrically connected to solder bumps located on the IC. The terminals protrude from the mounting surface of a substrate body on which the IC is to be mounted. The sectional area of the top surface of each of the terminals is about 1.2 times the sectional area of each of the terminals on the mounting surface.

4 Claims, 8 Drawing Sheets

FOREIGN PATENT DOCUMENTS

| | | |
|---|---|---|
| JP | 4-139848 A | 5/1992 |
| JP | 7-211722 A | 8/1995 |
| JP | 8-88470 A | 4/1996 |
| JP | 3203731 B2 | 8/2001 |
| JP | 2005-311225 A | 11/2005 |
| JP | 2007-324420 A | 12/2007 |
| WO | 2007/094123 A1 | 8/2007 |

OTHER PUBLICATIONS

Fukuda; "Circuit Substrate, Circuit Module and Method for Manufacturing the Circuit Substrate"; U.S. Appl. No. 12/717,171, filed Mar. 4, 2010.

* cited by examiner

CIRCUIT SUBSTRATE AND CIRCUIT SUBSTRATE MANUFACTURING METHOD

BACKGROUND OF THE INVENTION

1. Field of the Invention

The present invention relates to a circuit substrate and a circuit substrate manufacturing method and, in particular, to a circuit substrate on which an electronic component is to be mounted and a circuit substrate manufacturing method.

2. Description of the Related Art

Conventionally, when mounting an electronic component, such as an IC, on a circuit substrate, a mounting method as described below has been performed. Flat electrode pads are formed in an array on the main surface of the circuit substrate. On the other hand, solder bumps are formed in an array on the main surface of the IC. The IC is placed on the circuit substrate in such a manner that the solder bumps are positioned on the electrode pads, and then reflow is performed. Thus, the solder bumps are molten and then the solder bumps and electrode pads are fixed to each other. In this way, the IC is mounted on the circuit substrate.

However, when performing the above-mentioned mounting method, for example, the circuit substrate may become distorted by heat, since the thermal expansion coefficient of the circuit substrate is different from that of the IC. Thus, the circuit substrate and IC may make a poor connection with each other. For this reason, for semiconductor element substrates described in Patent Japanese Patent Publication No. 3203731 and Japanese Unexamined Patent Application Publication No. 08-88470, instead of flat electrode pads, column-shaped bumps are formed on the semiconductor element substrate so as to protrude from the main surface of the semiconductor element substrate.

Since the column-shaped bumps have a height unlike electrode pads, they have expansion/contraction properties.

Therefore, even if the circuit substrate becomes distorted by heat, the column-shaped bumps can absorb the distortion. As a result, the semiconductor element substrates described in Japanese Patent Publication No. 3203731 and Japanese Unexamined Patent Application Publication No. 08-88470 can prevent a poor connection between the circuit substrate and IC.

However, the above-mentioned semiconductor element substrates have a problem in that it is difficult to mount the IC on the circuit substrate accurately. Explanation will be made below with reference to the drawings. FIGS. 11A and 11B illustrate a portion of the process of mounting an IC 104 on a semiconductor element substrate 100.

As for the semiconductor element substrate 100, the IC 104 must be placed on the semiconductor element substrate 100 in such a manner that solder bumps 106 are aligned with column-shaped bumps 102, and then reflow must be performed.

However, due to formation accuracy of the column-shaped bumps 102 and solder bumps 106, distortion of the semiconductor element substrate 100, variations in the placement accuracy of the IC 104, or the like, the solder bumps 106 may be placed on the column-shaped bumps 102 so as to be misaligned with respect to the column-shaped bumps as shown in FIG. 11A. If the solder bumps 106 are placed on the column-shaped bumps 102 in a misaligned manner with respect to the column-shaped bumps as described above, the column-shaped bumps 102 and solder bumps 106 may lose contact with each other as shown in FIG. 11B due to shock applied during the period from the placement to reflow. When performing reflow in this state, the semiconductor element substrate 100 and IC 104 will make a poor connection with each other.

SUMMARY OF THE INVENTION

Accordingly, preferred embodiments of the present invention provide a circuit substrate that includes protruding terminals and prevents a poor connection with an electronic component, such as an IC, and also provide a circuit substrate manufacturing method.

According to a preferred embodiment of the present invention, a circuit substrate on which an electronic component is to be mounted includes a substrate body and a terminal to be electrically connected to a bump located on the electronic component. The terminal is arranged to protrude from a mounting surface of the substrate body on which the electronic component is to be mounted. The terminal has a structure such that an area of a top surface of the terminal preferably is about 1.2 times a sectional area of the terminal located at the mounting surface of the substrate body.

According to a preferred embodiment of the present invention, the top surface of the terminal is wider than the section of the terminal located at the mounting surface of the substrate body. For this reason, a loss of contact between the terminal and solder bump due to shock within the period from alignment between the terminal and solder bump to performance of reflow is prevented. As a result, a poor connection between the electronic component and circuit substrate is prevented.

In a preferred embodiment of the present invention, a sectional area of a section of the terminal that is parallel or substantially parallel with the mounting surface, preferably increases from the section of the terminal at the mounting surface to a top surface of the terminal, and a change rate of the sectional area of the terminal at an area of the top surface is preferably larger than a change rate of the sectional area of the section of the terminal at the mounting surface.

In a preferred embodiment of the present invention, the substrate body may include a plurality of laminated ceramic layers and an internal conductive layer laminated together with the ceramic layers, and the terminal may be electrically connected to the internal conductive layer.

A preferred embodiment of the present invention provides a circuit substrate on which an electronic component is to be mounted. The circuit substrate includes a substrate body and a terminal to be electrically connected to a bump on the electronic component. The terminal is arranged to protrude from a mounting surface of the substrate body on which the electronic component is to be mounted. A sectional area of a section of the terminal that is parallel or substantially parallel with the mounting surface increases from a section at the mounting surface of the substrate body to a top surface of the terminal and a change rate of the sectional area of the terminal at an area of the top surface is larger than a change rate of the sectional area of the section of the terminal at the mounting surface of the substrate body.

According to another preferred embodiment of the present invention, a method for manufacturing a circuit substrate on which an electronic component is to be mounted and that includes a terminal to be electrically connected to a bump located on the electronic component includes the steps of forming, on a first sheet, a mask layer softer than the first sheet; making a through hole on the mask layer; filling the through hole with a conductor; obtaining a multilayer body by crimping a plurality of second sheets, the first sheet, and the mask layer onto one another in such a manner that the mask layer is the uppermost layer; and eliminating the mask layer from the multilayer body.

In a preferred embodiment of the present invention, a softening point of the mask layer may be lower than a softening point of the first sheet.

In a preferred embodiment of the present invention, in the step of crimping the first sheet, the second sheets, and the mask layer onto one another, crimping may be performed while applying heat at a temperature that is higher than a softening point of the mask layer and lower than a softening point of the first sheet.

In a preferred embodiment of the present invention, in the step of making the through hole, the through hole may be made by applying a laser beam from the mask layer.

In a preferred embodiment of the present invention, the first sheet and the second sheets may be ceramic green sheets, the mask layer may be made of a resin, and in the step of eliminating the mask layer, the mask layer may be burned off when firing the multilayer body.

In a preferred embodiment of the present invention, in the step of making the through hole, the through hole may be formed to pass through the first sheet and the mask layer.

In a preferred embodiment of the present invention, in the step of crimping the mask layer, the first sheet, and the second sheets onto one another, a mold may be pressed against the mask layer and the first sheet with an elastic body interposed therebetween.

According to a preferred embodiment of the present invention, the top surface of the terminal is wider than the section of the terminal on the mounting surface of the substrate body. Therefore, the electronic component and circuit substrate are prevented from making a poor connection with each other.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
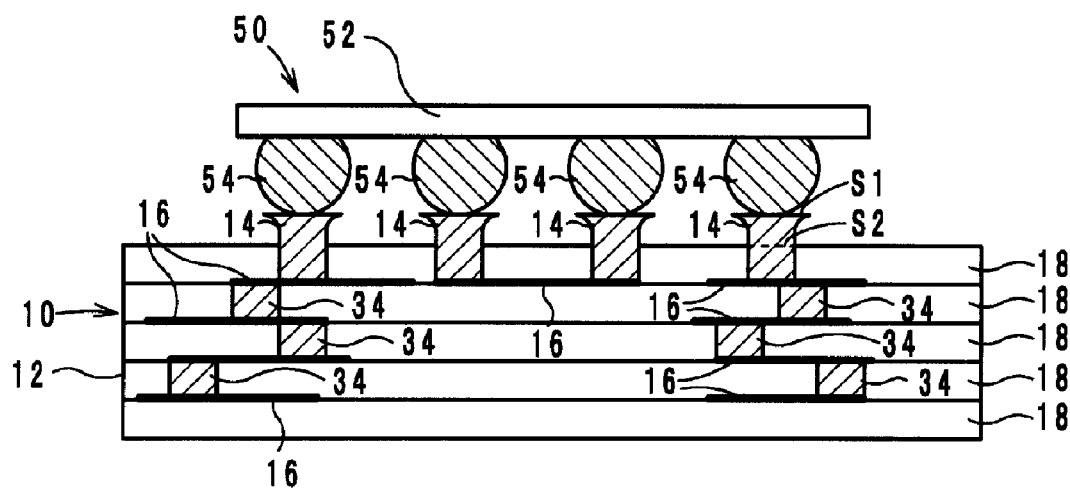
FIG. 1 a sectional structure drawing showing a state where an IC is aligned with a circuit substrate.
Figure 2:
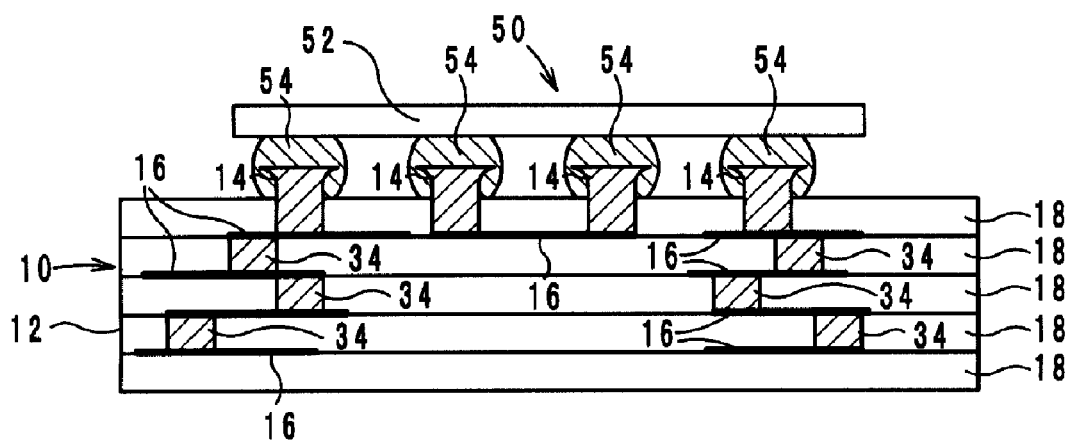
FIG. 2 is a drawing showing a sectional structure after reflow is performed on the IC and circuit substrate shown in FIG. 1.

A configuration of a circuit substrate will be described below with reference to the drawings. FIG. 1 is a sectional structure drawing showing a state where a semiconductor integrated circuit (hereafter referred to as an "IC") 50 is aligned with a circuit substrate 10. FIG. 2 is a drawing showing a sectional structure after reflow is performed on the IC 50 and circuit substrate 10 shown in FIG. 1.

The circuit substrate 10 is a substrate on which the IC 50, which is an electronic component, is to be surface-mounted. As shown in FIG. 1, the circuit substrate 10 includes a substrate body 12, terminal 14, and internal conductive layers 16. The substrate body 12 is preferably formed by laminating multiple ceramic layers 18, which are insulators. The internal conductive layers 16 are laminated together with the ceramic layers 18 inside the substrate body 12 so as to form a circuit. The internal conductive layers 16 are connected to one another through via conductors 34.

The multiple terminals 14 are formed in an array on the mounting surface of the substrate body 12 on which the IC 50 is to be mounted (hereafter simply referred to as the "mounting surface of the substrate body 12"), as protruding from the mounting surface and play a role of electrically connecting the circuit formed by the internal conductive layers 16 and the IC 50. For this reason, the terminals 14 are electrically connected to the internal conductive layers 16 inside the substrate body 12.

Figure 11A:
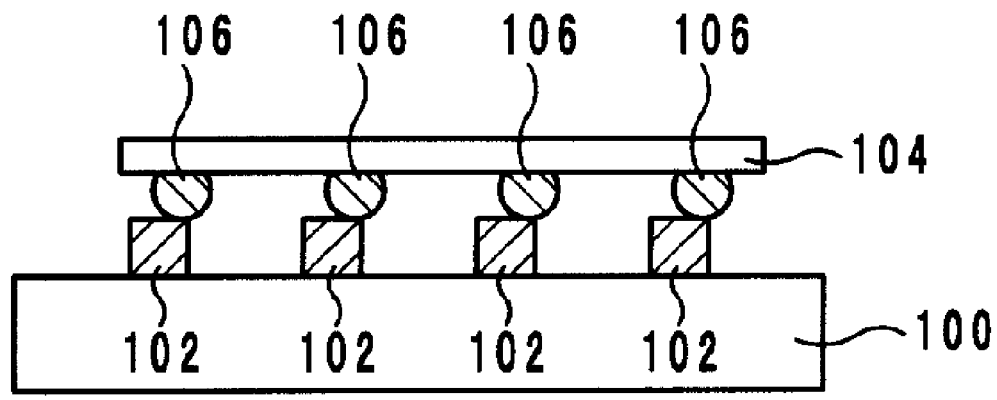
FIGS. 11A and 11B illustrate a portion of the process of mounting an IC on a semiconductor element substrate according to the related art.
Figure 11B:
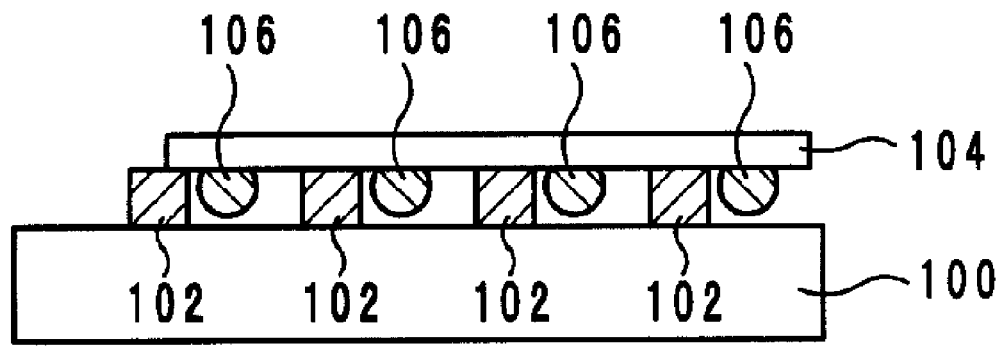

Also, the terminals 14 preferably are formed in such a manner that the area S1 of the top surface of each terminal 14 is larger than the sectional area S2 of each terminal 14 on the mounting surface of the substrate body 12. This prevents the column-shaped bumps 102 and solder bumps 106 from losing contact with each other due to shock as shown in FIG. 11B within the period from alignment of the IC 50 with the circuit substrate 10 to performance of reflow. The reason will be described later. The area S1 is preferably about 1.2 times or more the sectional area S2, for example. The area S1 of the top surface of each terminal 14 refers to the area of the shadow of each terminal 14 thrown on the mounting surface when applying parallel light to each terminal 14 in the direction of a normal to the mounting surface of the substrate body 12.

On the other hand, the IC 50 includes an IC body 52 and solder bumps 54. The IC body 52 is a body formed preferably by forming a circuit on a silicon substrate. The multiple solder bumps 54 are formed in an array on the mounting surface of the IC body 52 and serve as terminals for electrically connecting the circuit formed on the IC body 52 and the terminals 14.

The circuit substrate 10 and IC 50 configured as described above are preferably aligned with each other in such a manner that the terminals 14 and solder bumps 54 are brought into contact with each other, as shown in FIG. 1. The circuit substrate 10 and IC 50 are subjected to reflow. Thus, as shown in FIG. 2, the solder bumps 54 melt and become deformed as covering the terminals 14. As a result, the IC 50 is mounted on the circuit substrate 10.

A method for manufacturing the circuit substrate 10 configured as described above will be described below with reference to the drawings. FIGS. 3A to 6 are sectional views showing steps of the process of manufacturing the circuit substrate 10.

First, slurry obtained by mixing ceramic material powder containing barium oxide, silicon oxide, and alumina with a binder, a plasticizer, and a solvent is prepared. Next, this slurry is formed on a carrier film in the shape of a sheet using a sheet forming method, such as the doctor blade method, so as to obtain a ceramic green sheet. The ceramic green sheet is cut into predetermined sizes.

Figure 3A:
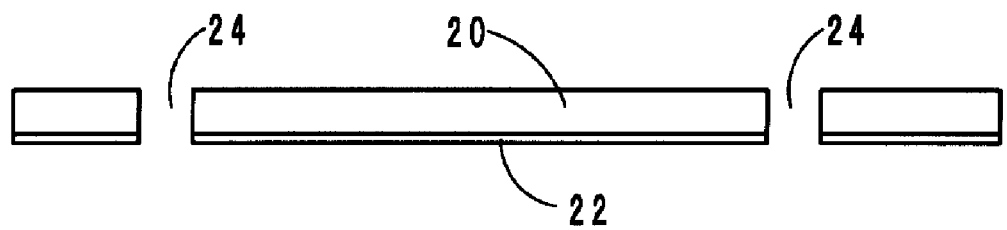
FIGS. 3A-3C are sectional views showing a step of the process of manufacturing the circuit substrate.
Figure 3B:
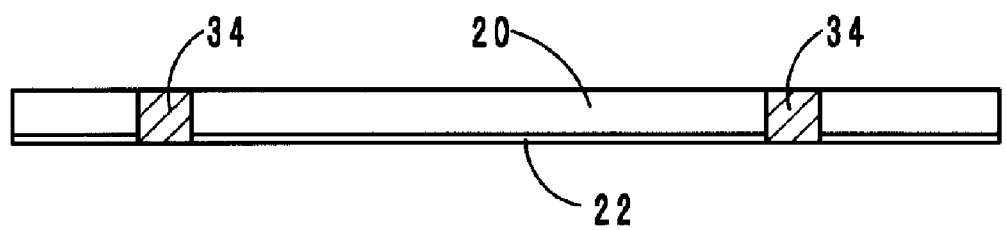

After the ceramic green sheet is completed, layers for constituting the substrate body 12 are manufactured. First, as shown in FIG. 3A, the ceramic green sheet 20 is subjected to punching so as to make through holes 24. Subsequently, as shown in FIG. 3B, the through holes 24 become filled with conductive paste mainly containing a conductor, such as Cu or Ag, so as to form via conductors 34.

Figure 3C:
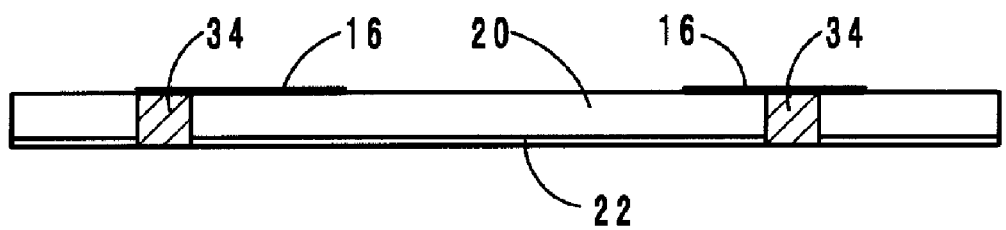

Subsequently, conductive paste mainly containing a conductor, such as Cu or Ag, is screen-printed on the main surface of the ceramic green sheet 20 so as to form the internal conductive layers 16 in predetermined patterns. By performing the steps shown in FIGS. 3A to 3C, one of the layers to constitute the substrate body 12 is completed. The steps shown in FIGS. 3A to 3C are repeated until all the layers to constitute the substrate body 12 are completed.

Figure 4A:
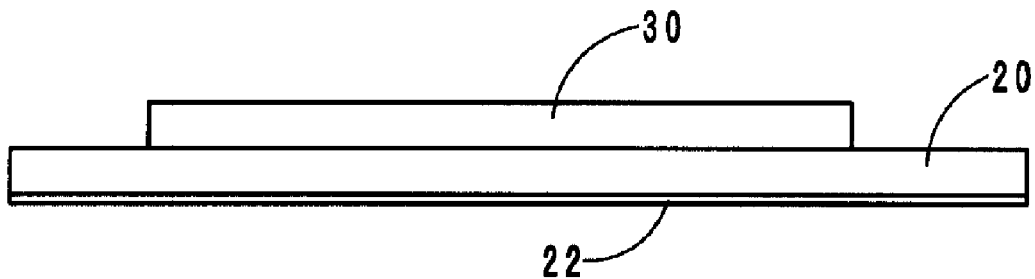
FIGS. 4A-4C are sectional views showing a step of the process of manufacturing the circuit substrate.

Next, a layer to be laminated in the uppermost layer of the substrate body 12 is made using the ceramic green sheet. Specifically, as shown in FIG. 4A, resin paste mainly containing polypropylene, butyral, acrylic, or the like is screen-printed on the main surface of the ceramic green sheet 20 so as to form a mask layer 30. The material forming the mask layer 30 preferably is a material that is softer than the ceramic green sheet 20 and becomes deformed easily. Further, the softening point of the material forming the mask layer 30 is preferably lower than the softening point of the material forming the ceramic green sheet 20.

Figure 4B:
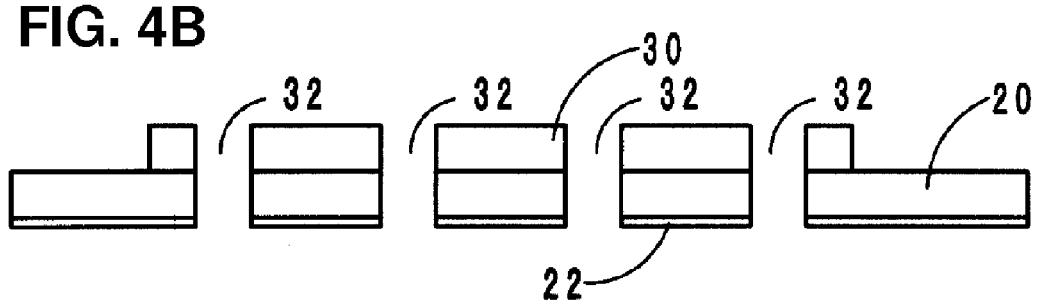
Figure 4C:
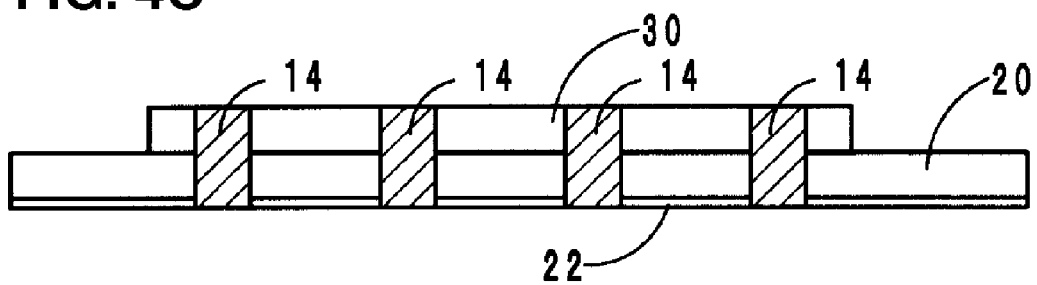

After forming the mask layer 30, as shown in FIG. 4B, the ceramic green sheet 20 and mask layer 30 are subjected to punching so as to make through holes 32 in such a manner that the through holes pass through the ceramic green sheet 20 and mask layer 30. Subsequently, as shown in FIG. 4C, the through holes 32 become filled with conductive paste mainly containing a conductor, such as Cu or Ag, so as to form the terminals 14. It should be noted that, in this stage, the terminals 14 do not take a shape where the area S1 of the top surface of each terminal 14 is larger than the sectional area S2 of each terminal 14 on the mounting surface of the substrate body 12 as shown in FIG. 1.

Figure 5A:
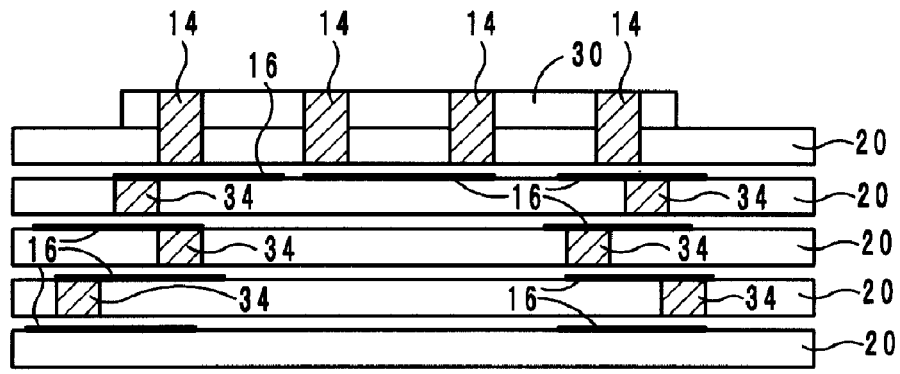
FIGS. 5A and 5B are sectional views showing a step of the process of manufacturing the circuit substrate.

Next, as shown in FIG. 5A, the mask layer 30 and ceramic green sheets 20 are laminated in such a manner that the mask layer 30 is the uppermost layer and the multiple ceramic green sheets 20 are located therebelow. It should be noted that, at the time of actual lamination, the carrier film 22 is peeled off from each ceramic green sheet 20 and then the ceramic green sheets 20 are laminated. Thus, an unfired multilayer body 40 is obtained.

Figure 5B:
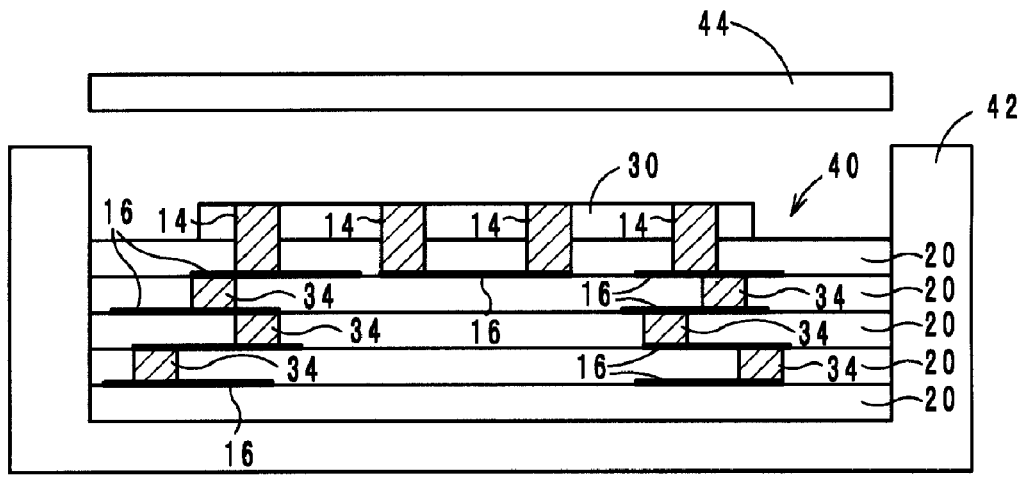
Figure 6:
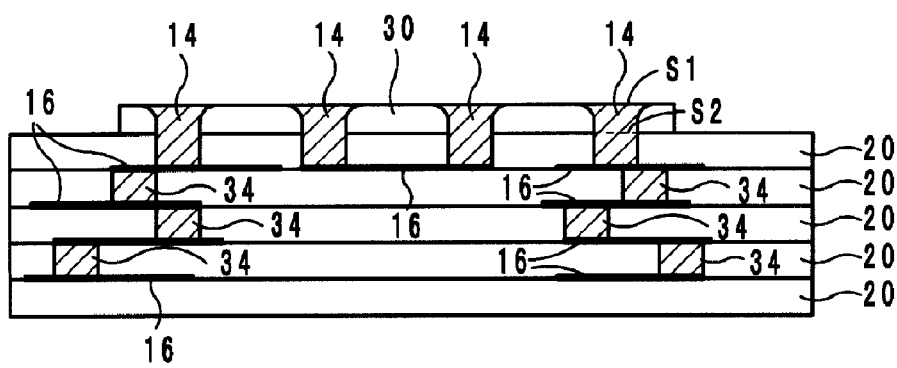
FIG. 6 is a sectional view showing a step of the process of manufacturing the circuit substrate.

Next, as shown in FIG. 5B, the obtained unfired multilayer body 40 is put into a base mold 42 and then pressure is applied to the ceramic green sheets 20 and mask layer 30 using a mold lid 44 from above so as to crimp the multilayer body 40. At that time, the crimping is performed while applying heat to the mold lid 44 at a temperature that is higher than the softening point of the material of the mask layer 30 and lower than the softening point of the material of the ceramic green sheets 20. Thus, only the mask layer 30 softens and is then crushed by the pressure of the mold lid 44 in the lamination direction. At that time, the top surfaces of the terminals 14 are also crushed and then expand in a direction perpendicular to the lamination direction. As a result, the terminals 14 take a shape such that the area S1 of the top surface of each terminal 14 is larger than the sectional area S2 of each terminal 14 on the mounting surface of the substrate body 12 as shown in FIG. 6. The crimping is preferably performed under the conditions that the temperature of the mold lid 44 is about 65° C. and that the pressure of the mold lid 44 is about 400 kg/cm$^2$, for example. The value of about 65° C. is the softening point of the material of the mask layer 30.

Finally, the unfired multilayer body 40 is fired. At that time, the mask layer 30 is burned off (burned away) by the high temperature. The firing is preferably performed at the temperature of about 990° C. for about one hour, for example. Through the above-mentioned steps, the circuit substrate 10 as shown in FIG. 1 is completed.

According to the circuit substrate 10, the area S1 of the top surface of each terminal 14 is larger than the sectional area S2 of each terminal 14 on the mounting surface of the substrate body 12. This prevents the column-shaped bumps 102 and solder bumps 106 from losing contact with each other as shown in FIG. 11B due to shock within the period from the alignment of the IC 50 with the circuit substrate 10 to the performance of reflow. In particular, if the area S1 is about 1.2 times larger than the sectional area S2, for example, a loss of contact between the column-shaped bumps 102 and solder bumps 106 is more effectively prevented. Hereafter, explanation will be made on the basis of the result of an experiment performed by the inventor.

Table 1 shown below is a table showing the relationship between S1/S2 and the incidence of a poor connection (short) between the circuit substrate 10 and IC 50.

TABLE 1

| S1/S2 | Short incidence |
|---|---|
| 1.052 | 8.3% |
| 1.108 | 3.2% |
| 1.169 | 1.4% |
| 1.235 | 0.1% |
| 1.306 | 0% |
| 1.384 | 0% |

As the conditions of the experiment, the interval between the terminals 14 was set to about 0.3 mm, and the area S1 of the top surface of each terminal 14 was set to about 0.0314 mm$^2$.

As is apparent from Table 1, when S1/S2 becomes about 1.2 or more, the short incidence decreases significantly. Accordingly, the area S1 is preferably about 1.2 times or more the sectional area S2.

Figure 7A:
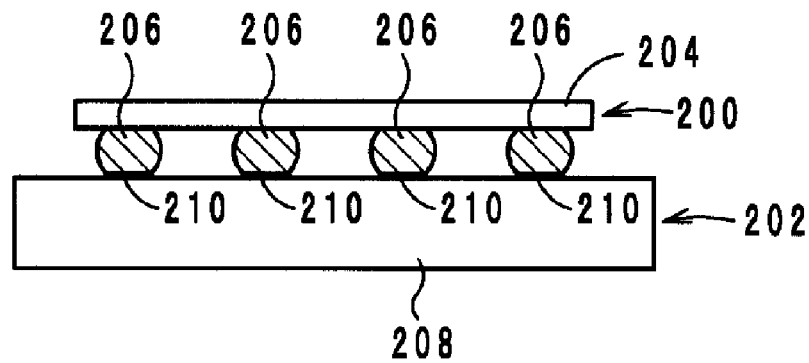
FIG. 7A is a sectional structure view showing the connection structure between an IC and a circuit substrate according to a first reference example.
Figure 7B:
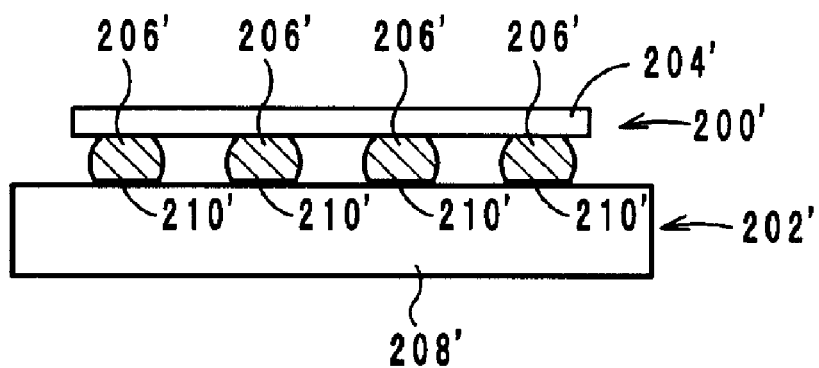
FIG. 7B is a sectional structure view showing the connection structure between an IC and a circuit substrate according to a second reference example.

Also, according to the circuit substrate 10, peeling off of the solder bumps 54 from the IC 50 after reflow is prevented. Explanation will be made below with reference to FIGS. 7A-7C. FIG. 7A is a sectional structure view showing the connection structure between an IC 200 and a circuit substrate 202 according to a first reference example. FIG. 7B is a sectional structure view showing the connection structure between an IC 200' and a circuit substrate 202' according to a second reference example.

Figure 7C:
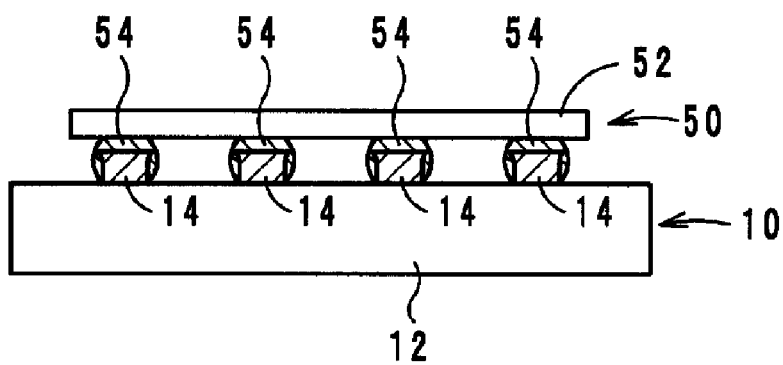
FIG. 7C is a sectional structure view showing the connection structure between the IC and circuit substrate according to this embodiment.

FIG. 7C is a sectional structure view showing the connection structure between the IC 50 and circuit substrate 10 according to the present preferred embodiment.

Conventionally, as shown in FIG. 7A, the IC 200 and circuit substrate 202 have been electrically connected to each other in such a manner that solder bumps 206 and electrode pads 210 are brought into contact with each other. However, if the electrode pads 210 are small, the solder bumps 206 may not be accurately placed on the electrode pads 210 as aligned with the electrode pads 210. For this reason, it is conceivable to increase the size of the electrode pads 210', as shown in FIG. 7B.

However, when increasing the size of the electrode pads 210' without changing the size of solder bumps 206', the contact area between each solder bump 206' and the corresponding electrode pad 210' is increased in accordance with the extent to which each electrode pad 210' is upsized. As a result, as shown in FIG. 7B, a significant difference is made between the contact area between each solder bump 206' and an IC body 204' and the contact area between each solder bump 206' and the corresponding electrode pad 210'. If such a difference is made, stress may be intensively applied between each solder bump 206' and IC body 204' having a small contact area so that the solder bumps 206' are peeled off from the IC body 204'.

On the other hand, according to the circuit substrate 10, as shown in FIG. 7C, if the sectional area S2 of each terminal 14 on the mounting surface of the substrate body 12 is made equal to the area of the corresponding electrode pad 210 as in the connection structure shown in FIG. 7C, the contact area between each solder bump 54 and IC body IC body 52 can be made equal to the contact area between each solder bump 54 and the lower end of the corresponding terminal 14 shown in FIG. 7C. As a result, the connection structure shown in FIG. 7C also prevents peeling off of the solder bumps 54 from the IC body 52, as with the connection structure shown in FIG. 7A.

Also, according to the circuit substrate 10, the terminals 14 and solder bumps 54 are prevented from losing contact with each other before reflow, and the adjacent solder bumps 54 can be prevented from becoming shorted to each other after reflow. Explanation will be made below with reference to the drawings.

Figure 8A:
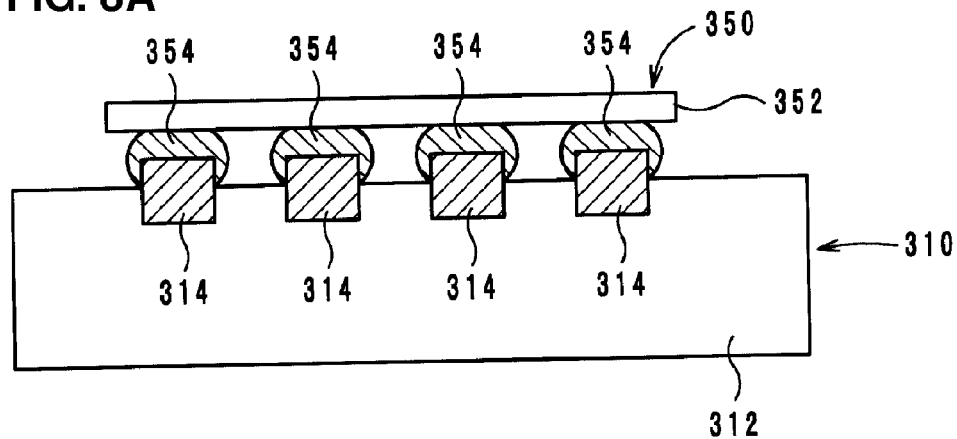
FIG. 8A is a sectional structure view showing the connection structure where an IC is mounted on a circuit substrate according to a third reference example.
Figure 8B:
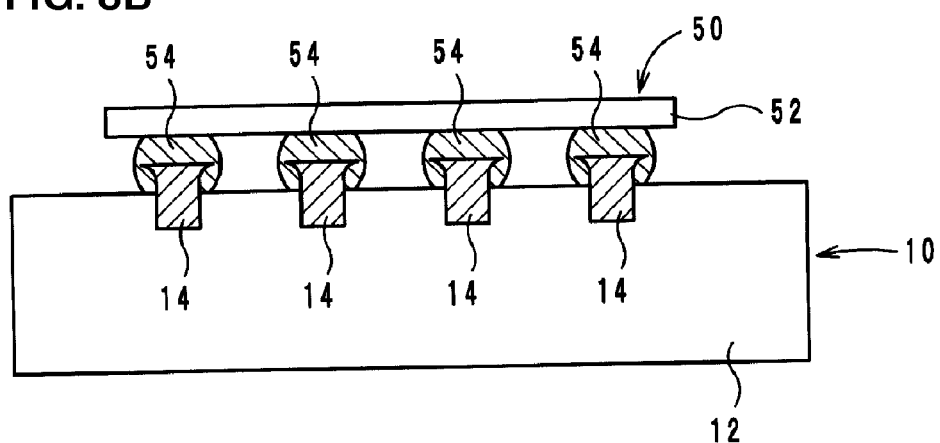
FIG. 8B is a sectional structure view showing the connection structure where the IC is mounted on the circuit substrate according to this embodiment.

FIG. 8A is a sectional structure view showing the connection structure where an IC 350 is mounted on a circuit substrate 310 according to a third reference example. FIG. 8B is a sectional structure view showing the connection structure where the IC 52 is mounted on the circuit substrate 10 according to this preferred embodiment.

The circuit substrate 310 shown in FIG. 8A preferably includes column-shaped terminals 314. On the other hand, the circuit substrate 10 shown in FIG. 8B preferably includes the terminals 14 having an expanded top surface. Since the terminals and column-shaped terminals 314 are constructed in such a manner that the areas of the top surfaces thereof are equal or substantially equal to each other, the probability that the terminals 14 are misaligned with the solder bumps 54 before reflow and the probability that the terminals 314 are misaligned with the solder bumps 354 before reflow are equal to each other.

Incidentally, the sectional area of each terminal 314 except for the vicinity of the top surface thereof is larger than the sectional area of each terminal 14 except for the vicinity of the top surface thereof. Therefore, the volume of each terminal 314 is larger than the volume of each terminal 14. If the volume of each solder bump 54 and that of each solder bump 354 are equal to each other, the external shape of each solder bump 354 after reflow becomes larger than the external shape of each solder bump 54 by the difference between the volume of each terminal 314 and that of each terminal 14, as shown in FIG. 8A. Therefore, the distance between the solder bumps 354 after reflow is smaller than that between the solder bumps 54 after reflow. That is, if the terminals 314 are thick enough so that the probability that each terminal 14 is misaligned with the corresponding solder bump 54 before reflow and the probability that each terminal 314 is misaligned with the corresponding solder bump 354 before reflow are equal to each other, the distance between the solder bumps 354 is reduced after the reflow. Thus, the probability that a short occurs between the solder bumps 354 is increased. In other words, the circuit substrate 10 can reduce the probability that the terminals 14 are misaligned with the solder bumps 54 before reflow, as well as can reduce the probability that the solder bumps 54 become shorted to each other after the reflow.

As for the circuit substrate 10 shown in FIG. 1, punching is preferably performed to form the through holes 24 and 32; however, the method for making the through holes 24 and 32 is not limited thereto. For example, the through holes 24 and 32 may be made using laser processing. When making the through holes 32 using laser processing, it is preferable to apply laser beams from the mask layer 30. The laser beams are thinned down while making the through holes 32 on the ceramic green sheet 20 and consuming energy. For this reason, the through holes 32 each take a shape whose diameter increases from bottom to top. As a result, the value of the ratio of the area S1 of the top surface of each terminal 14 to the sectional area S2 of each terminal 14 on the mounting surface of the substrate body 12 can be easily increased.

Figure 9:
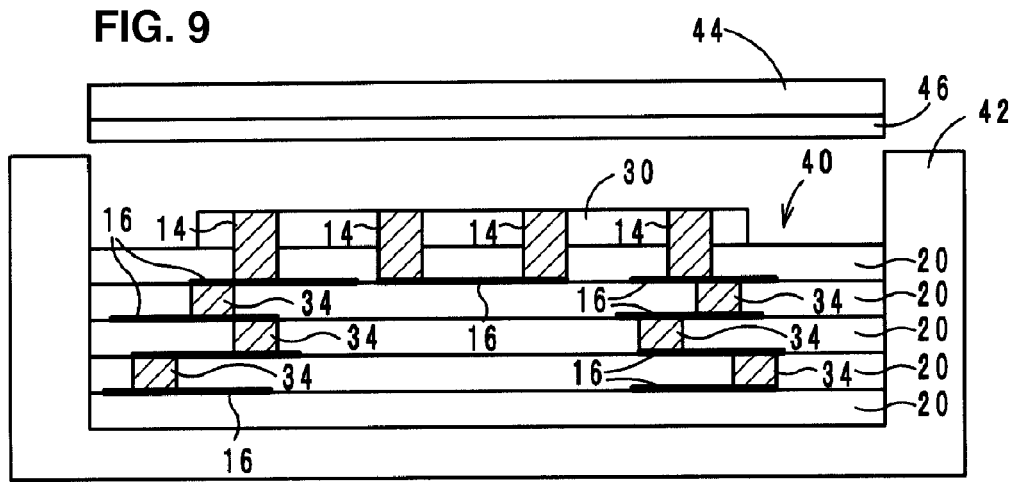
FIG. 9 is a sectional view showing a step of the process of manufacturing a circuit substrate according to a modification.

While the mold lid 44 preferably is directly pressed against the mask layer 30 and ceramic green sheets 20 in FIG. 5B, the mold lid 44 may be pressed against the mask layer 30 and ceramic green sheets 20 with an elastic body 46 interposed therebetween as shown in FIG. 9. FIG. 9 is a sectional view showing a step of the process of manufacturing the circuit substrate 10 according to the modification. By interposing the elastic body 46, the value of the ratio of the area S1 of the top surface of each terminal 14 to the sectional area S2 of each terminal 14 on the mounting surface of the substrate body 12 can be increased more effectively, since the elastic body 46 expands at the time of crimping. Hereafter, explanation will be made on the basis of the result of an experiment performed by the inventor.

Table 2 shown below is a table showing the value of S1/S2 in a case where the elastic body 46 is used at the time of crimping and that in a case where the elastic body 46 is not used at the time of crimping. In this experiment, the temperature of the mold lid 44 at the time of crimping was set to approximate values of 48° C., 62° C., and 67° C. The pressure of the mold lid 44 was set to about 510 kg/cm$^2$.

TABLE 2

| | S1/S2 | |
|---|---|---|
| Temperature | With elastic body | Without elastic body |
| 48° C. | 1.291 | 1.221 |
| 62° C. | 1.506 | 1.417 |
| 67° C. | 1.563 | 1.469 |

From Table 2, it is understood that, by interposing the elastic body 46, the value of the ratio of the area S1 of the top surface of each terminal 14 to the sectional area S2 of each terminal 14 on the mounting surface of the substrate body 12 can be increased more effectively. Also, from this experiment, it is understood that, by increasing the pressure, it is possible to deform the terminals 14 sufficiently even when performing crimping at a temperature equal to or less than the softening point of the material of the mask layer 30.

Figure 10A:
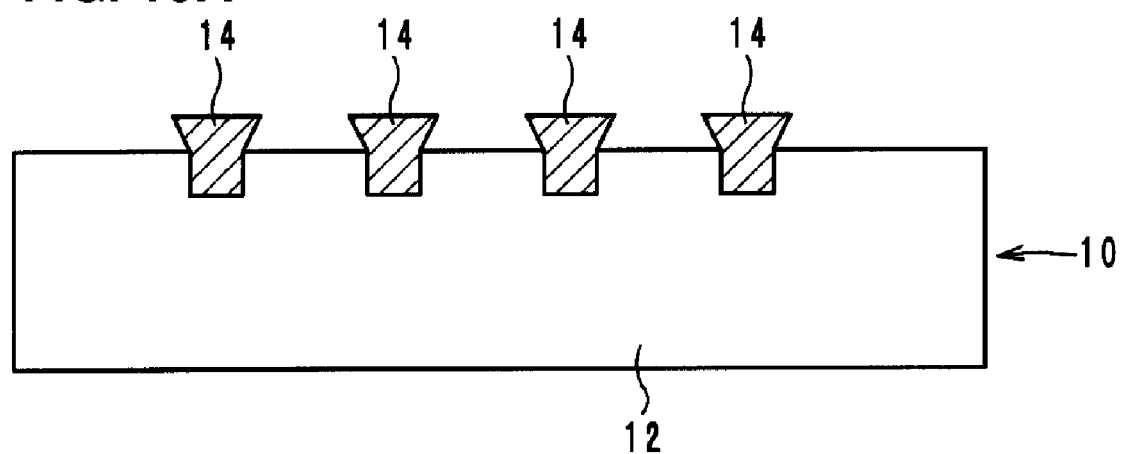
FIGS. 10A and 10B illustrate a modification of terminals.
Figure 10B:
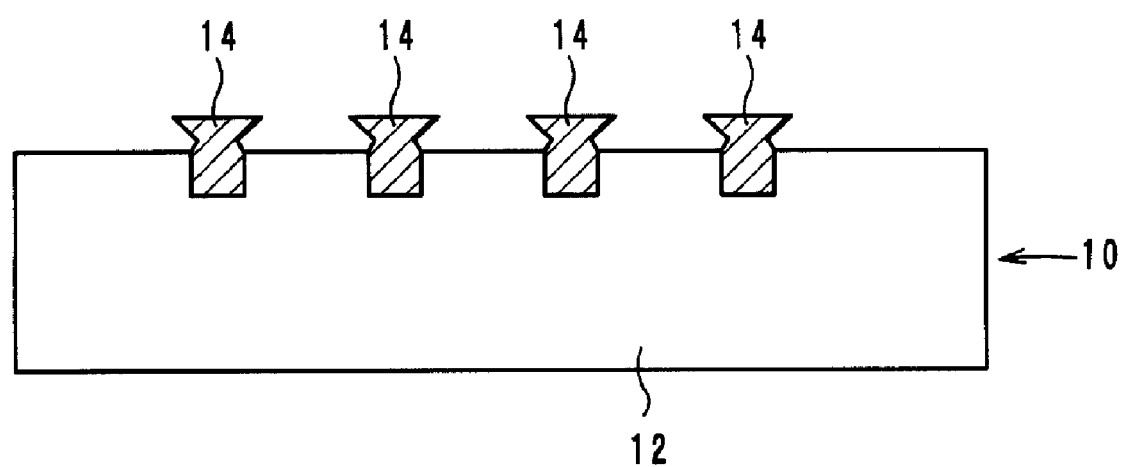

The terminals 14 may take shapes as shown in FIGS. 10A and 10B. FIGS. 10A and 10B include drawings showing a modification of the terminals 14. More specifically, as shown in FIG. 10A, the terminals 14 may each have a section taking the shape of an isosceles trapezoid whose top and bottom are inverted, above the mounting surface of the substrate body 12. Also, as shown in FIG. 10B, the terminals 14 may each have a partially necked sectional shape, above the mounting surface of the substrate body 12.

However, in view of ease with which the terminals 14 are processed, as shown in FIG. 1, the terminals 14 preferably each take a shape such that the sectional area of a section parallel or substantially parallel with the mounting surface of the substrate body 12, of each terminal 14 increases from the mounting surface to the top surface of the terminal 14 and such that the change rate of the sectional area of each terminal 14 in the vicinity of the top surface is larger than the change rate of the sectional area of each terminal 14 in the vicinity of the mounting surface. This is because, when the terminals 14 are crushed by the mold lid 44 in the crimping step shown in FIG. 5B, the vicinity of the top surface of each terminal 14 is intensively crushed and thus the increase rate of the sectional area of each terminal 14 abruptly increases in the vicinity of the top surface.

Accordingly, various preferred embodiments of the present invention are useful for a circuit substrate and a circuit substrate manufacturing method. In particular, preferred embodiments of the present invention are excellent in that an electronic component and a circuit substrate are prevented from making a poor connection with each other.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A circuit substrate on which an electronic component is to be mounted, the circuit substrate comprising:
    a substrate body; and
    a terminal to be electrically connected to a bump on the electronic component, the terminal being arranged to protrude from a mounting surface of the substrate body on which the electronic component is to be mounted; wherein
    an area of a top surface of the terminal is about 1.2 times a sectional area of a section of the terminal at the mounting surface of the substrate body.

2. The circuit substrate according to claim 1, wherein
    a sectional area of a section of the terminal that is parallel or substantially parallel with the mounting surface increases from the mounting surface to the top surface of the terminal; and
    a change rate of the sectional area of the terminal at an area of the top surface is larger than a change rate of the sectional area of the section of the terminal at the mounting surface.

3. The circuit substrate according to claim 1, wherein
    the substrate body includes a plurality of laminated ceramic layers and an internal conductive layer laminated together with the ceramic layers; and
    the terminal is electrically connected to the internal conductive layer.

4. A circuit substrate on which an electronic component is to be mounted, the circuit substrate comprising:
    a substrate body; and
    a terminal to be electrically connected to a bump on the electronic component, the terminal being arranged to protrude from a mounting surface of the substrate body on which the electronic component is to be mounted; wherein
    a sectional area of a section of the terminal that is parallel or substantially parallel with the mounting surface increases from a section at the mounting surface to a top surface of the terminal; and
    a change rate of the sectional area of the terminal at an area of the top surface is larger than a change rate of the sectional area of the section of the terminal at the mounting surface.

* * * * *